(12) United States Patent
Manack et al.

(10) Patent No.: US 11,631,632 B2
(45) Date of Patent: Apr. 18, 2023

(54) THREE DIMENSIONAL PACKAGE FOR SEMICONDUCTOR DEVICES AND EXTERNAL COMPONENTS

(71) Applicant: Texas Instruments Incorporated, Dallas, TX (US)

(72) Inventors: Christopher Daniel Manack, Flower Mound, TX (US); Sreenivasan Kalyani Koduri, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/135,700

(22) Filed: Dec. 28, 2020

(65) Prior Publication Data

US 2022/0208655 A1 Jun. 30, 2022

(51) Int. Cl.
*H01L 23/495* (2006.01)
*H01L 23/31* (2006.01)
*H01L 21/56* (2006.01)
*H01L 21/48* (2006.01)

(52) U.S. Cl.
CPC ...... *H01L 23/4952* (2013.01); *H01L 21/4825* (2013.01); *H01L 21/565* (2013.01); *H01L 23/3114* (2013.01); *H01L 23/49513* (2013.01); *H01L 23/49527* (2013.01); *H01L 23/49575* (2013.01)

(58) Field of Classification Search
CPC ............. H01L 23/4952; H01L 23/3114; H01L 23/49513; H01L 23/49527; H01L 23/49575; H01L 21/4825
See application file for complete search history.

(56) References Cited

U.S. PATENT DOCUMENTS

| | | | |
|---|---|---|---|
| 9,324,687 B1* | 4/2016 | Kelkar | H01L 25/16 |
| 2008/0169561 A1* | 7/2008 | Yamaguchi | H01L 24/11 |
| | | | 257/737 |
| 2017/0162481 A1* | 6/2017 | Lin | H01L 24/72 |
| 2019/0341332 A1* | 11/2019 | Lin | H01L 25/18 |

\* cited by examiner

*Primary Examiner* — Marc Anthony Armand
(74) *Attorney, Agent, or Firm* — Yudong Kim; Frank D. Cimino

(57) ABSTRACT

In a described example, an apparatus includes: a package substrate having a die mount portion and lead portions; at least one semiconductor device die over the die mount portion of the package substrate, the semiconductor device die having bond pads on an active surface facing away from the package substrate; electrical connections between at least one of the bond pads and one of the lead portions; a post interconnect over at least one of the bond pads, the post interconnect extending away from the active surface of the semiconductor device die; and a dielectric material covering a portion of the package substrate, the semiconductor device die, a portion of the post interconnect, and the electrical connections, forming a packaged semiconductor device, wherein the post interconnect extends through the dielectric material and had an end facing away from the semiconductor device die that is exposed from the dielectric material.

27 Claims, 13 Drawing Sheets

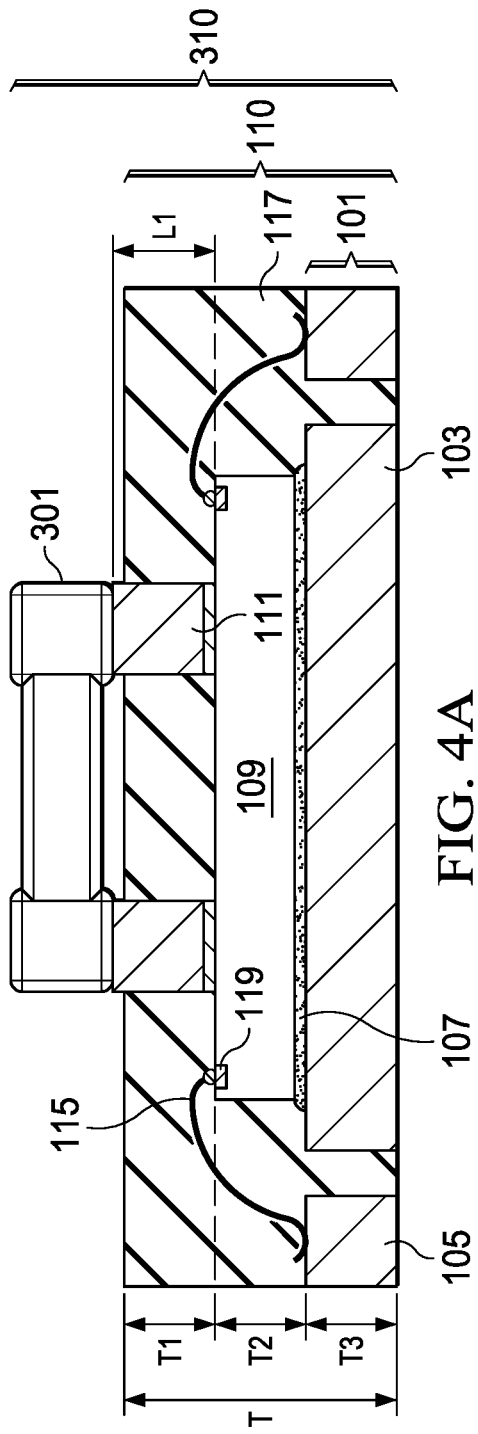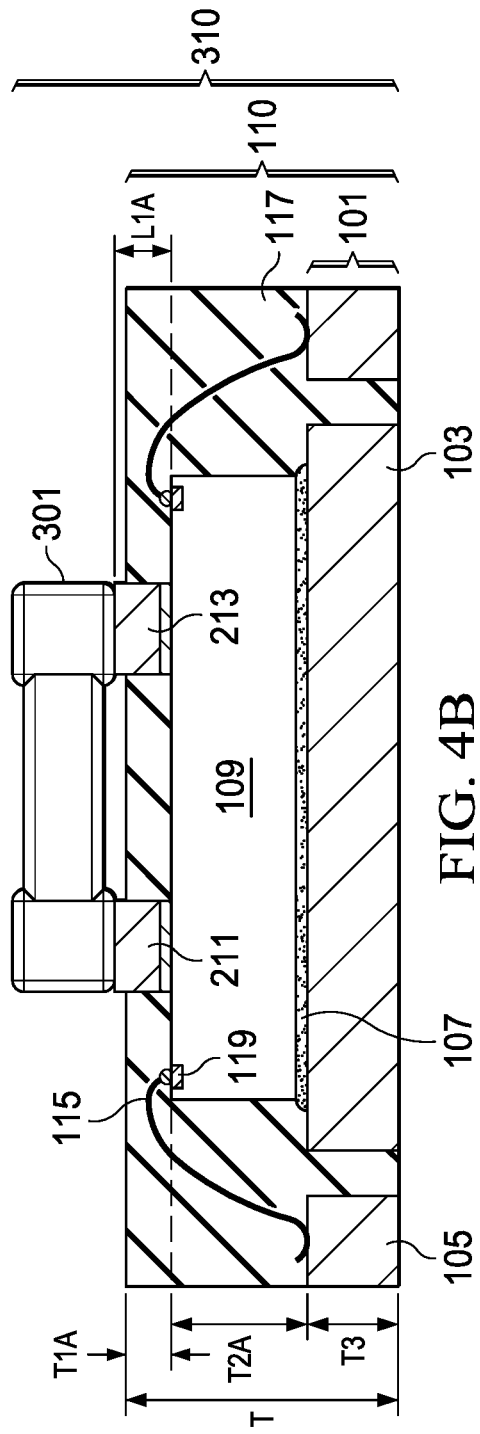
FIG. 4A
FIG. 4B

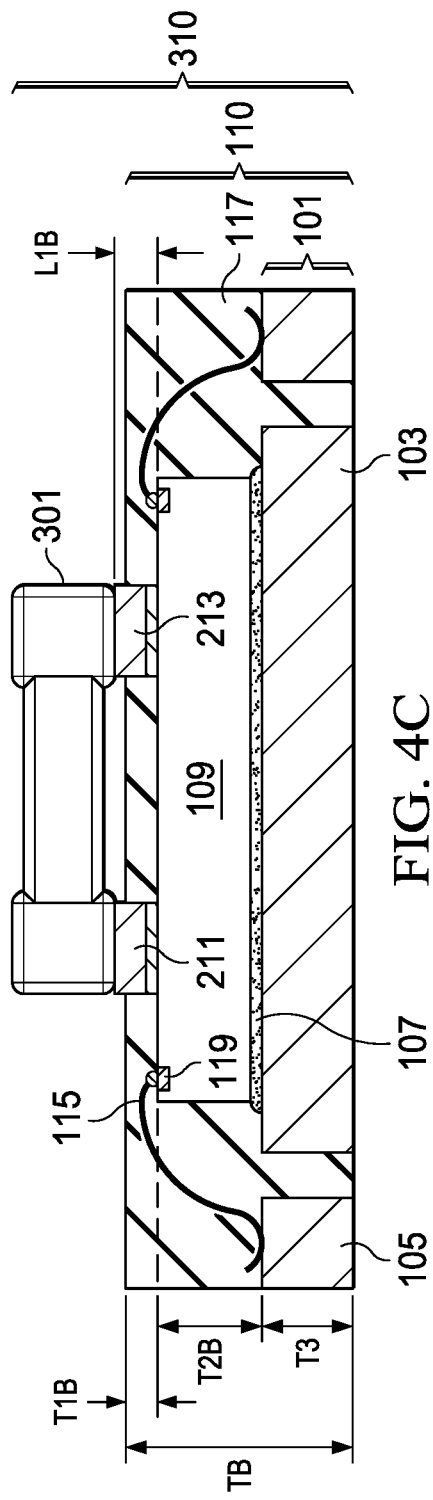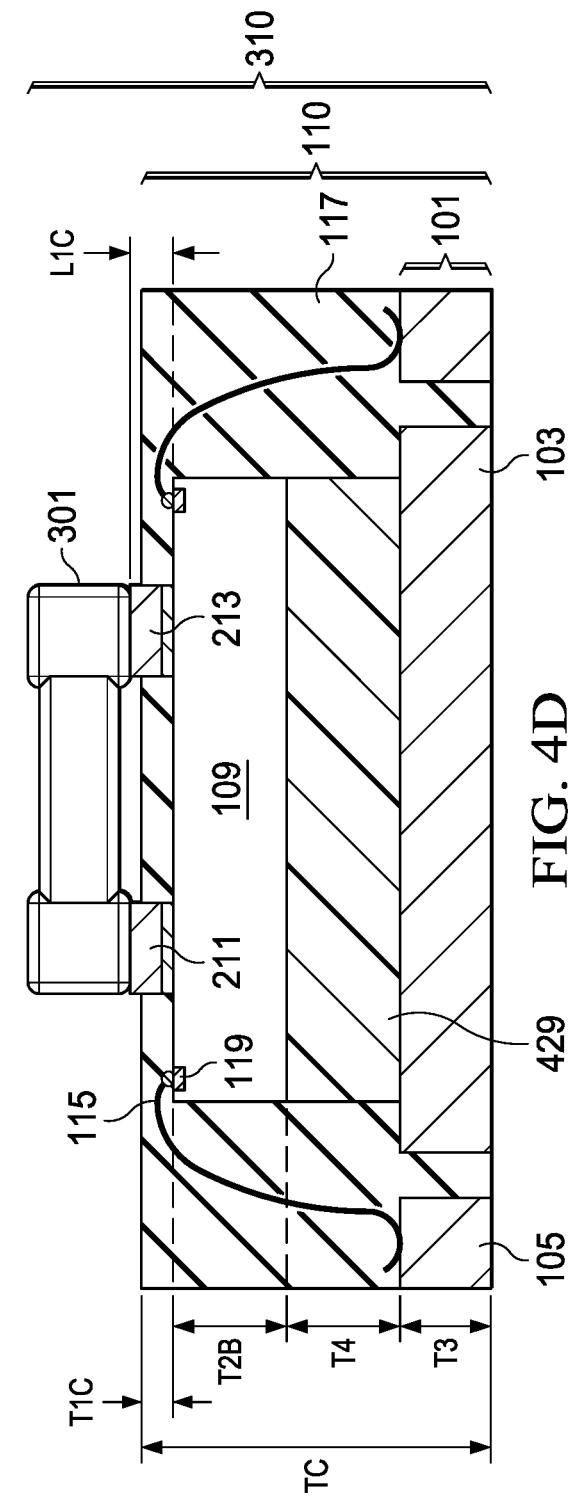

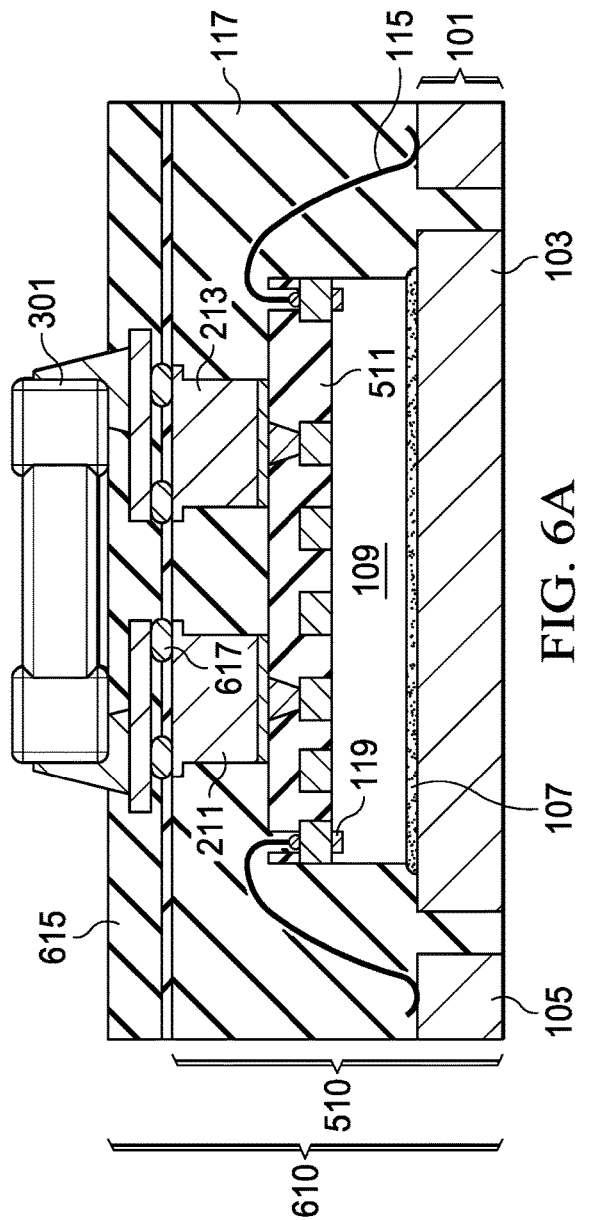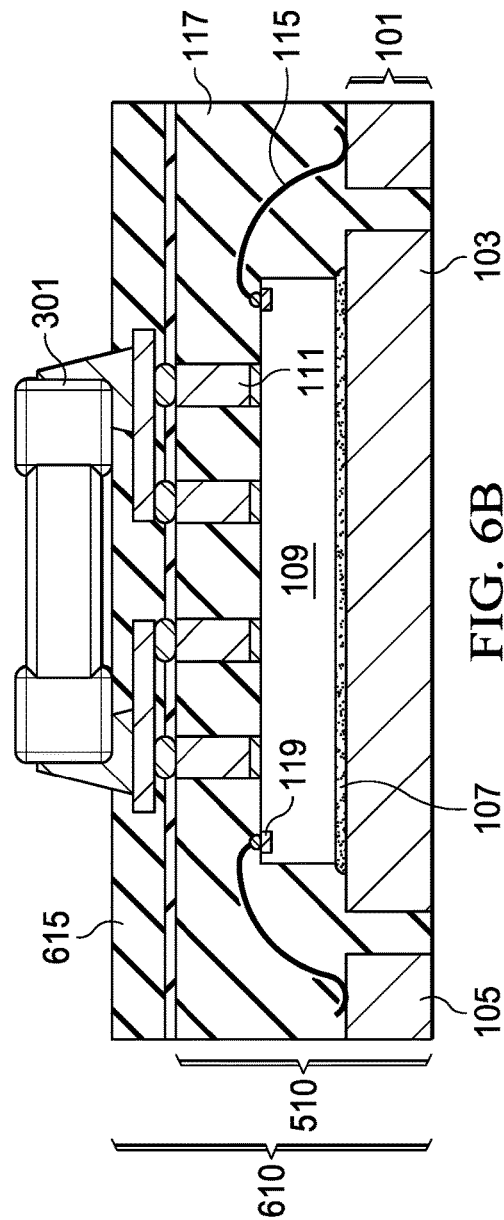

THREE DIMENSIONAL PACKAGE FOR SEMICONDUCTOR DEVICES AND EXTERNAL COMPONENTS

TECHNICAL FIELD

This disclosure relates generally to packaging for semiconductor devices, and more particularly to packages of semiconductor devices with external electronic components.

BACKGROUND

Packages for semiconductor devices that include passive devices, sensors, or even multiple semiconductor devices are increasingly used to reduce the board area needed on a system board. A passive component, for example a capacitor, resistor, inductor, sensor, or a photocell, may be electrically coupled to a semiconductor device, such as a digital processor or analog to digital converter. An active component, for example another packaged semiconductor device, can be electrically coupled to a semiconductor device. In some packaging solutions for a semiconductor device with external components, a stacking approach is used. Package on package (PoP) or other stacked package solutions can require through silicon vias or through substrate vias (TSVs). TSVs may require laser drilling or other mechanical or deep etch operations to form a via hole extending through a semiconductor package, a substrate or circuit board, which is then filled with or lined with a conductor. In some solutions, packaged ball grid array (BGA) devices are stacked, requiring relatively expensive BGA packages with conductive lands and balls on two opposite planar surfaces for at least some of the stacked packaged devices. These stacked arrangements can have high parasitic capacitance and high resistance and leakage, and may contribute to noise or signal loss, or have unwanted coupling between conductors. Stacked dies have been used within packages, requiring expensive leadframes and complex wire bonding operations with multiple wire loop heights and lengths, reducing reliability of the wire bonds.

SUMMARY

In a described example, an apparatus includes: a package substrate having a die mount portion and lead portions; at least one semiconductor device die over the die mount portion of the package substrate, the semiconductor device die having bond pads on an active surface facing away from the package substrate; electrical connections between at least one of the bond pads and one of the lead portions; a post interconnect over at least one of the bond pads, the post interconnect extending away from the active surface of the semiconductor device die; and a dielectric material covering a portion of the package substrate, the semiconductor device die, a portion of the post interconnect, and the electrical connections, forming a packaged semiconductor device, wherein the post interconnect extends through the dielectric material and had an end facing away from the semiconductor device die that is exposed from the dielectric material.

BRIEF DESCRIPTION OF THE DRAWINGS

FIGS. 4A-4D are cross-sectional views illustrating alternative arrangements for a packaged semiconductor device with post interconnects coupling an external component to a semiconductor device die within the packaged semiconductor device.

FIGS. 6A-6B are cross sectional views illustrating alternative arrangements for a packaged semiconductor device with post interconnects coupling an external component mounted on a surface of the packaged semiconductor device to a semiconductor device die, and including an external redistribution layer on the packaged semiconductor device.

DETAILED DESCRIPTION

Figure 1:
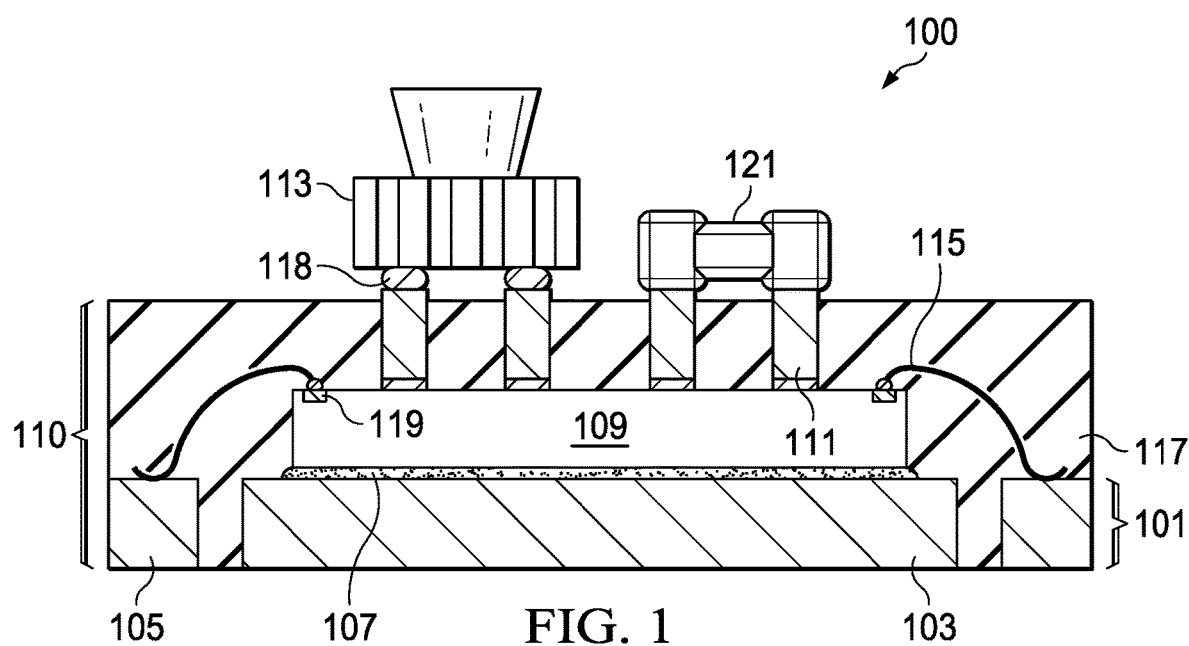
FIG. 1 is a cross sectional view of a packaged semiconductor device with external components mounted on an external surface.

Corresponding numerals and symbols in the different figures generally refer to corresponding parts, unless otherwise indicated. The figures are not necessarily drawn to scale.

The term "semiconductor device" is used herein. As used herein, a semiconductor device is a device manufactured using semiconductor material. The semiconductor device can be a discrete component such as a resistor, inductor, capacitor, coil, diode or other passive element. The semiconductor device can be one or more transistors. The semiconductor device may include several or even thousands of transistors and may be referred to as an "integrated circuit". The semiconductor device can be a circuit. Examples include analog and digital circuits such as filters, analog to digital converters, digital to analog converters, sensors, power transistors, power supplies, charge pumps, switches, photocells, transducers, diodes, bulk acoustic wave devices, antennas, receivers, transmitters, transceivers, processors, digital signal processors, amplifiers, shifters, counters, clock circuits, phase locked loops, microcontrollers, bus drivers, and systems on a chip, memory devices, registers, volatile and non-volatile storage circuitry, and other integrated circuits. The term "semiconductor device die" is used herein. As used herein, a semiconductor device die is a single semiconductor device. The term "packaged semiconductor device" is used herein. As used herein a packaged semiconductor device is a semiconductor device die in a protective package, such as a plastic, resin or molded package.

The term "active surface" is used herein in reference to a surface of a semiconductor device die. An active surface of a semiconductor device die is a surface with components formed on it using semiconductor manufacturing processes such as ion implants, oxidation, anneal, chemical and vapor deposition, etch, photolithography, plating, and other processes used to form semiconductor devices. "Bond pads" are described herein. Bond pads of a semiconductor device are conductive pads formed on the active surface that provide electrical connection to the components in the semiconductor device.

The term "package substrate" is used herein. A package substrate is a substrate that supports a semiconductor device die within a device package. Examples of package substrates include leadframes, pre-molded leadframes (PMLF), molded interconnect substrates (MIS), circuit boards, laminate, film and tape substrates, and semiconductor substrates.

In this description, when the term "coupled" describes relationships between elements, "coupled" is not limited to "connected" or "directly connected," but may also include connections made with intervening elements, and additional elements and various connections may exist between any elements that are "coupled."

In this description, the term "post interconnect" is used. As used herein a post interconnect is a conductive element that extends from a first end through a dielectric material and has a second end exposed from the dielectric material to provide a terminal for connecting an electrical component outside the dielectric material to a device within the dielectric material. Post interconnects in example arrangements include conductive columns that extend from a semiconductor device die in a package to a surface of the package.

In the arrangements, a package for a semiconductor device and for an external component includes post interconnects on an active surface of a semiconductor device in a package, the semiconductor device covered by a dielectric material forming a package body, the post interconnects extending from the semiconductor device through the dielectric material of the package body. An external component is mounted to the package and coupled to the post interconnects to electrically couple the external component to the semiconductor device. In some arrangements more than one external component can be mounted on a package and coupled to the semiconductor device by post interconnects.

FIG. 1 illustrates in a cross sectional view an arrangement 100. A packaged semiconductor device 110 has two external components, a laser device 113 and a capacitor 121 mounted on a surface of the packaged semiconductor device 110 (the upper surface of the packaged semiconductor device 110 as oriented in FIG. 1). A package substrate 101, in this example a conductive leadframe, is shown with a die mounting portion 103 and with leads 105 spaced from the die mounting portion 103. Die attach 107 adheres a semiconductor device die 109 to the die mounting portion 103 on a device side surface of the package substrate 101 (the upper surface of the package substrate as oriented in FIG. 1). The package substrate has a board side surface opposite the device side surface (the bottom of package substrate 101 as oriented in FIG. 1 is the board side surface). Bond pads 119 disposed on an active surface of the semiconductor device die 109 electrically couple to circuitry formed within the semiconductor device die 109 (not shown) and form electrical connection terminals for the semiconductor device die 109. Bond wires 115 connect selected ones of the bond pads 119 to leads 105 of the package substrate 101. The leads 105 are spaced from the die mounting portion 103 and from one another, and a portion of the leads 105 is exposed from the package to form terminals for the packaged semiconductor device 110. A dielectric material 117 covers the semiconductor device die 109 and portions of the package substrate 101 while other portions of leads 105 remain exposed from dielectric material 117 for use in surface mounting to a system board or module; the leads 105 forming the electrical terminals for the packaged semiconductor device 110.

In FIG. 1, post interconnects 111 extend from bond pads 119 on the active surface of the semiconductor device die 109 through the dielectric material 117 and the post interconnects have ends exposed at the upper surface (as oriented in FIG. 1) of packaged semiconductor device 110. The post interconnects 111 form vertical connections (again as oriented in FIG. 1) through the dielectric material 117 of the package. The exposed end of post interconnects 111 provides terminals for mounting external components on the package 110 that are electrically coupled to semiconductor device die 109. In this example, a vertical cavity semiconductor laser component (VCSEL) 113 is mounted to two post interconnects and coupled to the packaged semiconductor device 110 using solder balls 118, while a capacitor 121, which is in a two terminal package, is soldered to the ends of two post interconnects 111. The post interconnects 111 can be of various sizes and are conductive. The post interconnects 111 can be of copper, for example, to provide a low resistance and low parasitic path between the components and the semiconductor device die 109 inside the packaged semiconductor device 110. In addition to copper, alternative materials for the post interconnects include gold, palladium, platinum, silver, nickel, tin and alloys of these.

Figure 2A:
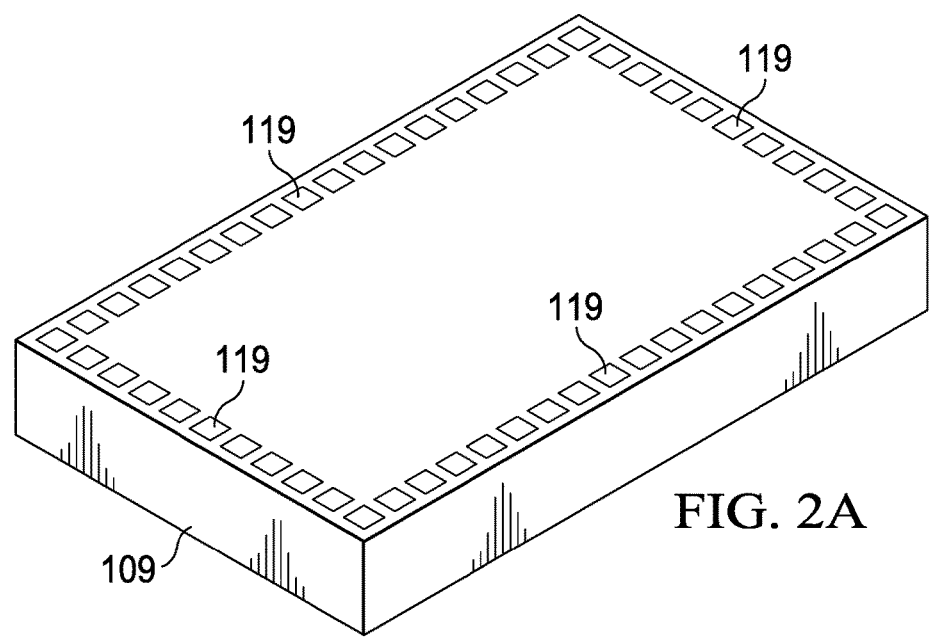
FIGS. 2A-2J are a series of projection views illustrating selected steps of a method for forming a packaged semiconductor device used in an arrangement.
Figure 2B:
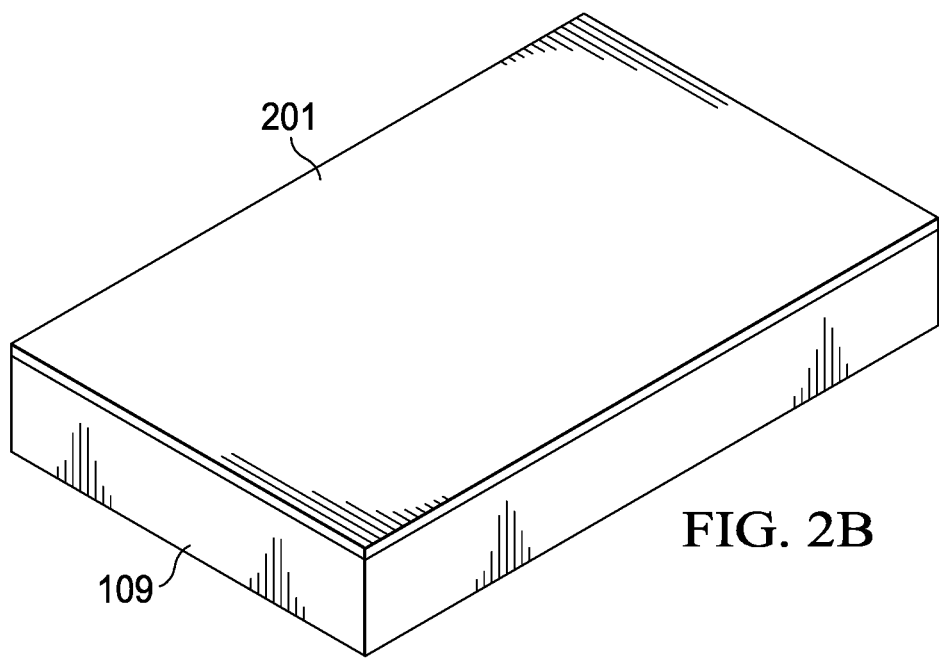

FIGS. 2A-2J illustrate in a series of selected steps an example method for forming an arrangement. FIG. 2A illustrates in a projection view, the semiconductor device die 109 with bond pads 119 on an active surface of the semiconductor device die. FIG. 2B illustrates the semiconductor device die 109 with a seed layer 201 sputtered or otherwise deposited over the active surface (the bond pads 119 are obscured in this view). The seed layer 201 can be a material used in an electroplating process described further below, for example, the seed layer can be copper or copper alloy. Note that while a single semiconductor device die 109 is shown in FIGS. 2A-2I for clarity of illustration, at this method step the semiconductor device die 109 is part of a semiconductor wafer (not shown) with multiple semiconductor devices formed on it, and the seed layer 201 is sputtered onto the wafer.

Figure 2C:
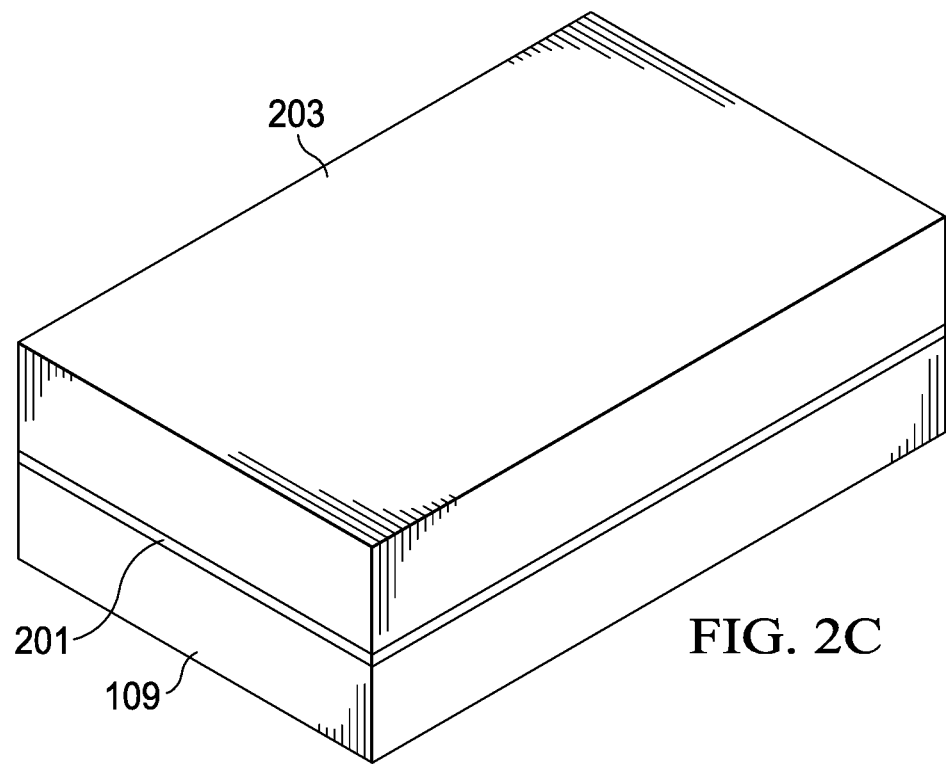

FIG. 2C illustrates the semiconductor device die 109 after a photoresist layer 203 is deposited over the seed layer (not visible as it is covered by photoresist layer 203), the active surface and bond pads of the semiconductor device die 109, which are also obscured by the photoresist layer 203. Photoresist materials that can be used include positive and negative type photoresists, and other photoresists used in semiconductor or circuit board manufacture.

Figure 2D:
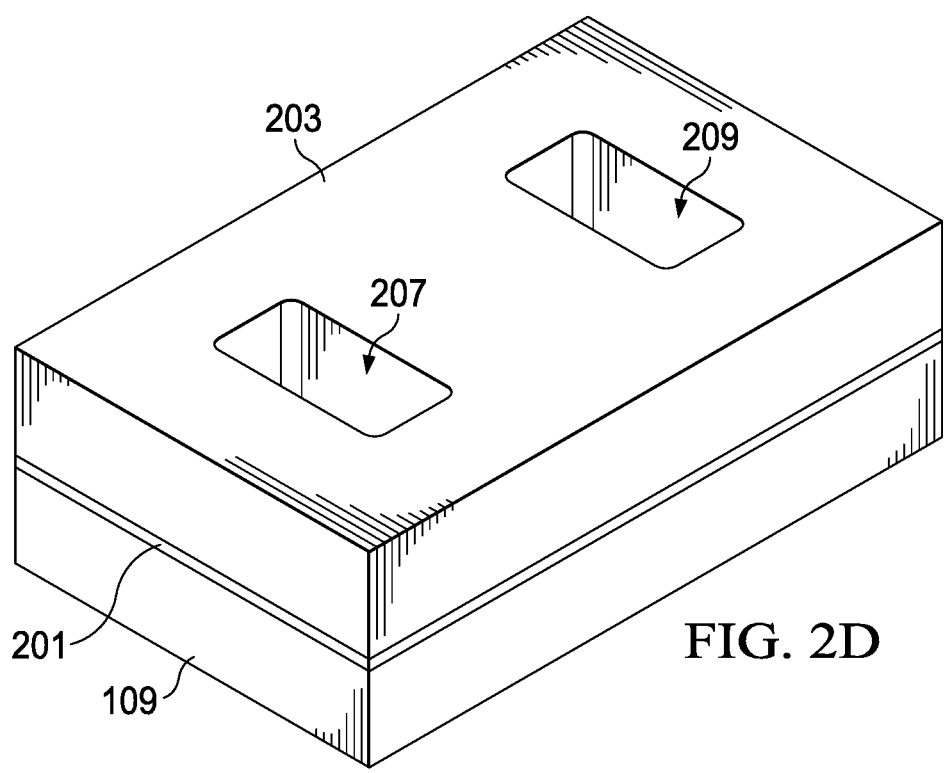

FIG. 2D illustrates openings 207 and 209 formed by patterning and developing photoresist layer 203 in a photolithographic process. The openings 207 and 209 extend through the photoresist layer 203 and expose the seed layer 201 in the openings.

Figure 2E:
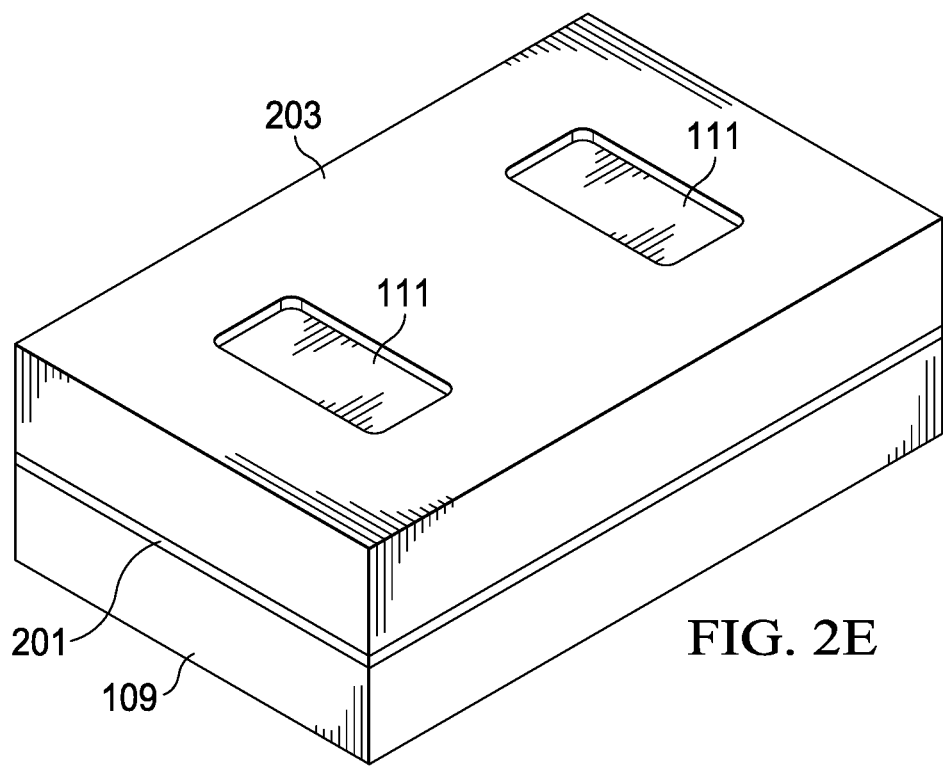

FIG. 2E illustrates post interconnects 111 formed in the openings in the photoresist layer by electroplating or by electroless plating of a conductive material. In an example copper post interconnects are formed using a copper seed layer in the plating process. Other materials such as gold, platinum, silver, nickel, tin, palladium and alloys of these can be used to form the post interconnects. Gold, nickel, tin, palladium and alloys or multiple layers of these can also be used to form coatings on the surface of post interconnects that are formed of other materials. These coatings are used to reduce ion diffusion, increase solderability, and prevent tarnish on post interconnects formed of other materials, such as copper or silver. In the example shown, the post interconnects 111 are rectangular shaped columns when seen from a top view. In alternatives the post interconnects may be columns that are circular or oval in cross section, square or other shapes can be used. Because the post interconnects form electrical paths and are far larger in diameter than a bond wire, for example, the resistance obtained by use of the post interconnects is lower than an alternative connection such as a TSV, solder ball, bond wire or bond ribbon connection that might otherwise have been used, and the parasitics of the post interconnects are low. Bond wires used in semiconductor packaging can range from about 19 to 25 microns in diameter. The post interconnects can be much larger in diameter, for example ranging from about 50 to about 350 microns. The resistance of a conductor is inversely proportional to the square of the diameter, so the post interconnects can have a resistance that is roughly 100 times less than a bond wire, the arrangements provide a low resistance path between the semiconductor device within the package and the external component.

Figure 2F:
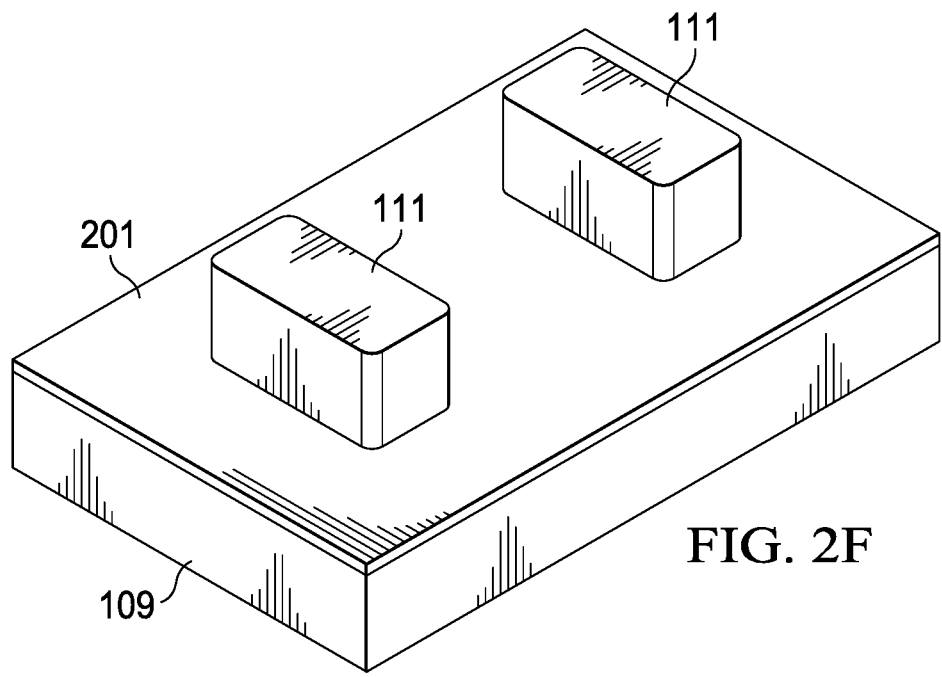

FIG. 2F illustrates post interconnects 111 and seed layer 201 after the photoresist layer (see photoresist 203 in FIG. 2E) is removed. Chemical strippers or dry etching in a plasma reactor such as "ashing" can be used to remove the photoresist layer. The seed layer 201 is exposed.

Figure 2G:
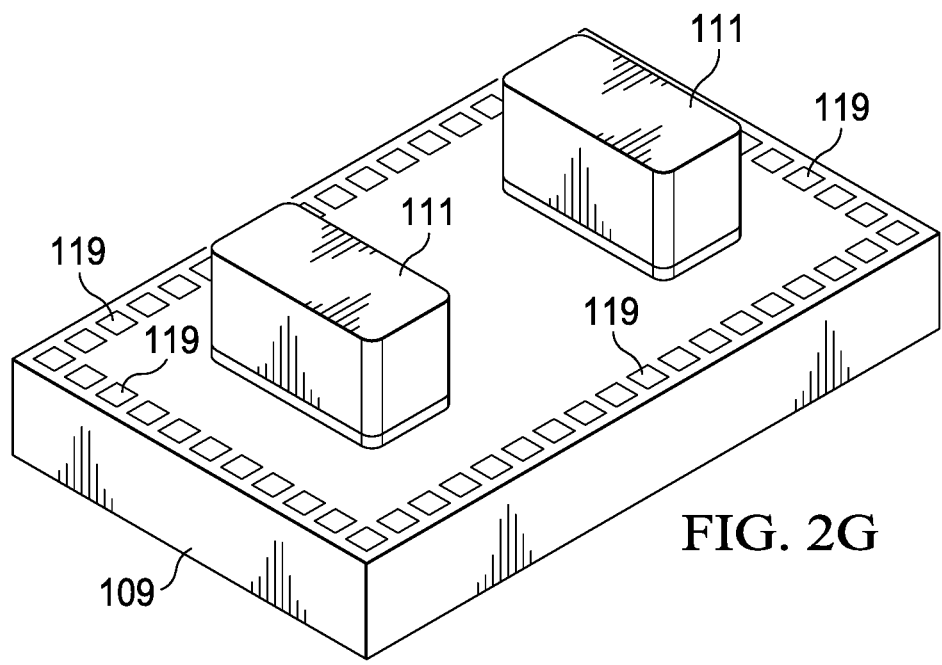

FIG. 2G illustrates the post interconnects 111 on the semiconductor device die 109 with bond pads 119 exposed after the seed layer (see 201 in FIG. 2F) is removed. The seed layer 201 (see FIG. 2F) can be removed by wet etchants selective to the seed layer material, for example by etchants selective to copper. Some loss of the material in the post interconnects 111 can be expected in this etch, and the post interconnects can be sized appropriately to account for this expected loss.

Figure 2H:
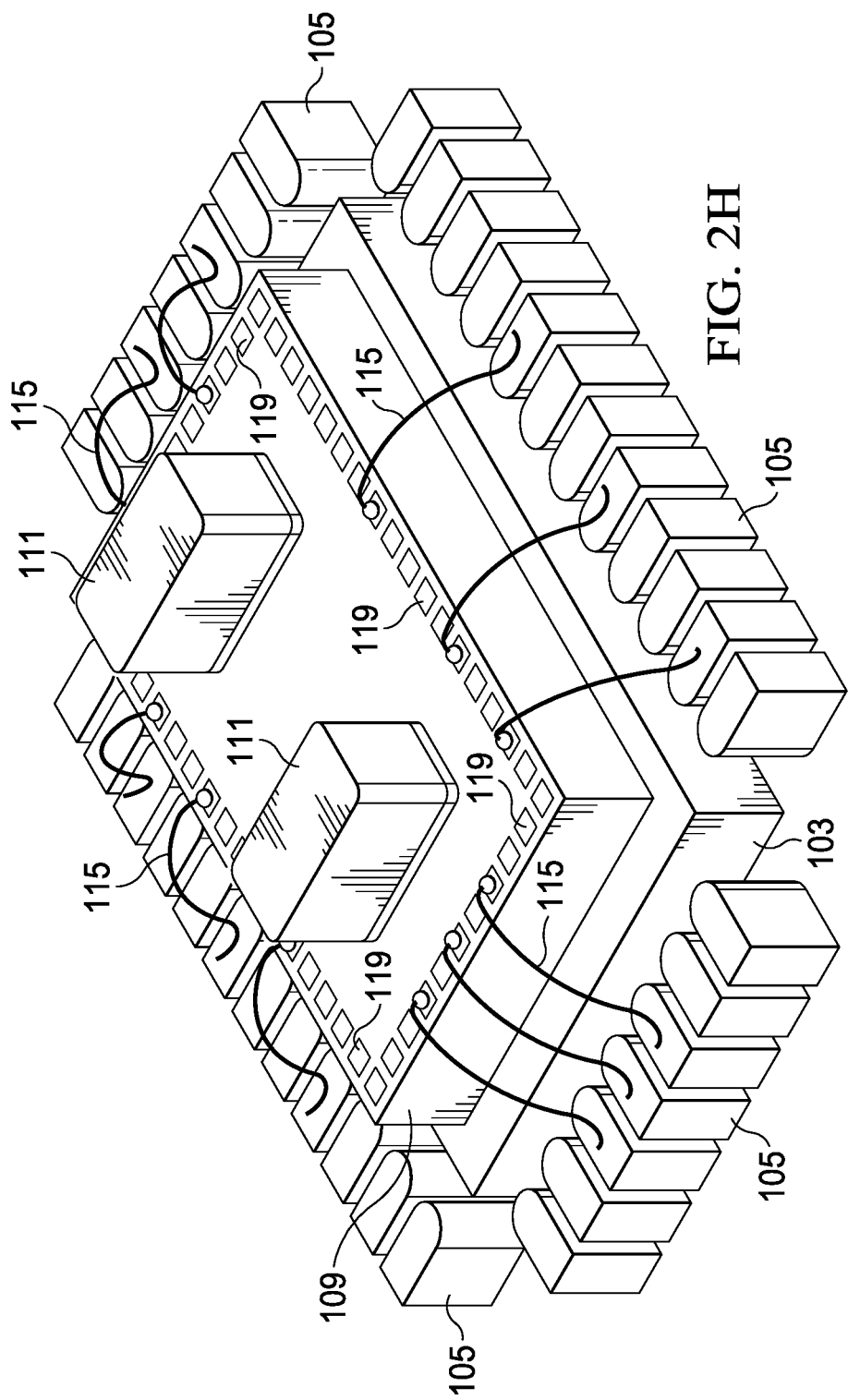

FIG. 2H illustrates a semiconductor device die 109 with the post interconnects 111 after the semiconductor device die 109 is mounted on a package substrate over die mounting portion 103 and leads 105 spaced from the die mounting portion 103. The semiconductor device die 109 is removed from the semiconductor wafer having multiple semiconductor device dies formed on it by a dicing or "singulation" process used in semiconductor manufacture. The semiconductor device dies are formed in an array of devices in rows and columns that are spaced from each other by scribe lines. A mechanical saw, laser, or etch process is used to cut through the semiconductor wafer along the scribe lines, separating the individual semiconductor device dies one from another, or "singulating" the semiconductor device dies from the wafer. A pick and place tool can then be used to mount a semiconductor device to the package substrate using a die attach adhesive or epoxy. The package substrate can be a leadframe, a PMLF, MIS, a tape, laminate or film carrying conductors, or a circuit board with conductive traces. While a single semiconductor device die 109 is shown in FIG. 2H for clarity of illustration, in a production process a leadframe strip or leadframe array in rows and columns is populated with a plurality of semiconductor device dies, which are then each connected electrically to the corresponding leads in a wire bonding tool. Wire bonds such as 115 connect the leads 105 to the bond pads 119 on the semiconductor device die 109. The wire bonds 115 can be "ball and stitch" wire bonds, where a bond formed at the end of a capillary in a wire bonding tool is placed on the bond pad of the semiconductor device die by thermasonic, compressive, or sonic energy. The wire extends through a capillary in a wire bonding tool. As the wire bonding tool capillary moves from the ball, the bond wire is allowed to extend and loop from the ball towards the lead, and the wire bonding tool forms a pressure "stitch" welding the bond wire to the conductive lead 105. The tool leaves the stitch in place by breaking the bond wire after the wire stitch connection is made. Heat or a flame used in the wire bonding tool then forms a new ball at the end of the bond wire at the capillary in the tool, and these wire bonding operations repeat and continue. In alternative arrangements, wire ribbons can be used in place of the bond wires to connect the semiconductor device die 109 to the leads 105. In some arrangements, the backside of semiconductor device die (the side opposite the active surface, and mounted to the die mount area 103 of the package substrate) is electrically coupled to the package substrate in die mount area 103, and the die mount area 103 has a board side surface (not visible) that will be connected to ground, for example, on a system board. In other alternative arrangements, an additional bond wire connection may be made from a bond pad on the active surface of semiconductor device die 109 to the die mount area 103, which can then be used as an additional electrical connection for power or ground, for example. In some arrangements the die mount portion 103 of the package substrate has a board side surface that may be exposed from the package material in the final package. This board side surface can form a thermal path for removing heat from the semiconductor device die 109.

Figure 2I:
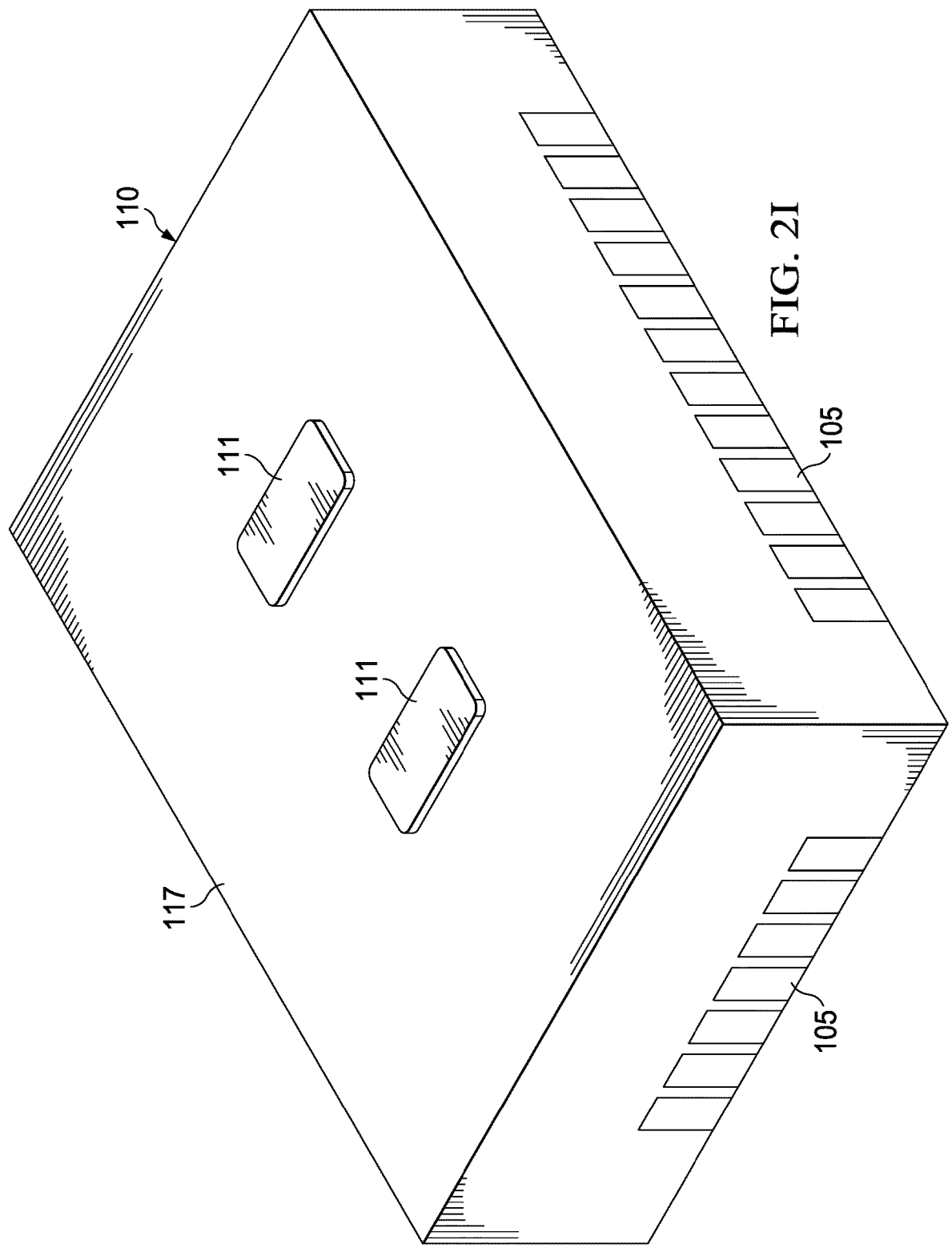

FIG. 2I illustrates the semiconductor device die 109 and the package substrate including leads 105 after a package body is formed of dielectric material 117. The dielectric material 117 protects the semiconductor device die and completes a packaged semiconductor device 110. The dielectric material can be formed in an encapsulation molding process using mold compound. Useful mold compound materials include thermosetting epoxy resin, including metal and non-metal fillers, resin, and plastics. Post interconnects 111 extend through the package body and have ends exposed from the dielectric material 117 to form package terminals on an upper surface of the packaged semiconductor device 110 (as the elements are oriented in FIG. 2J) for mounting additional devices. In the example, the post interconnects 111 have exposed ends that extend above the upper surface of the package body. This structure can be formed by using a tape or film in a molding tool, so that the encapsulation process does not cover the entire length of the post interconnects 111 during encapsulation. In another alternative arrangement, the exposed ends of the post interconnects 111 are coplanar with the upper surface of the dielectric material 117. As shown in FIG. 2I the semiconductor device die 109, the bond wires, and portions of the package substrate including the die mount portion and portions of the leads 105 are covered by the dielectric material 117, which protects the device from moisture and from damage. Portions of leads 105 are exposed to form electrical terminals for surface mount technology ("SMT") mounting of the packaged semiconductor device 110 to a system board. The packaged semiconductor device 110 can be shipped as a product to a customer that adds an external component mounted on the post interconnects 111. In another approach, an arrangement includes the external component and forms a complete product to be shipped to a customer, see FIG. 3 below.

Figure 2J:
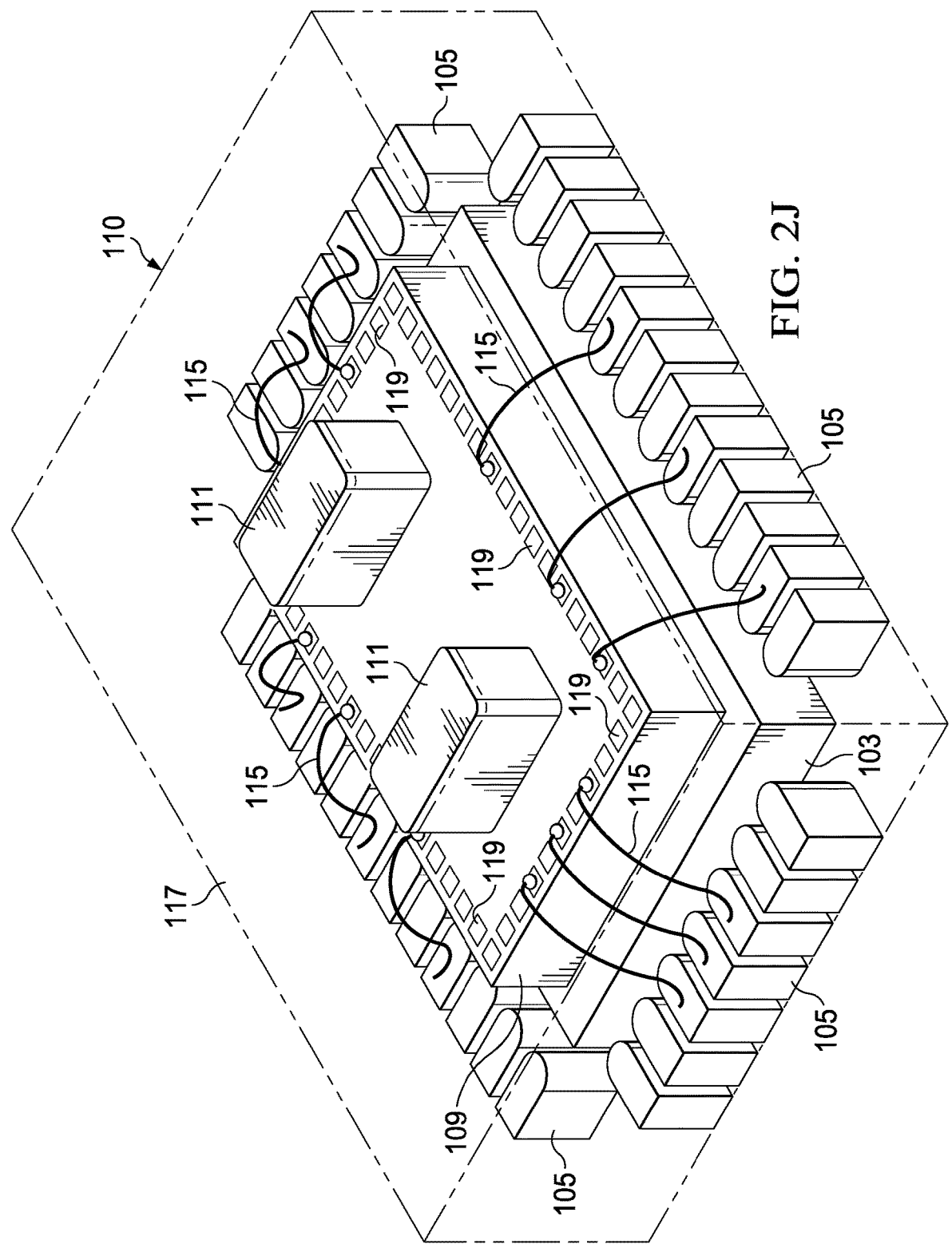

FIG. 2J is a projection view of packaged semiconductor device 110 in a partially transparent view that illustrates the bond wires 115, the semiconductor device die 109, and the bond pads 119, which are enclosed by the dielectric material 117, which can be mold compound, for example.

Figure 3:
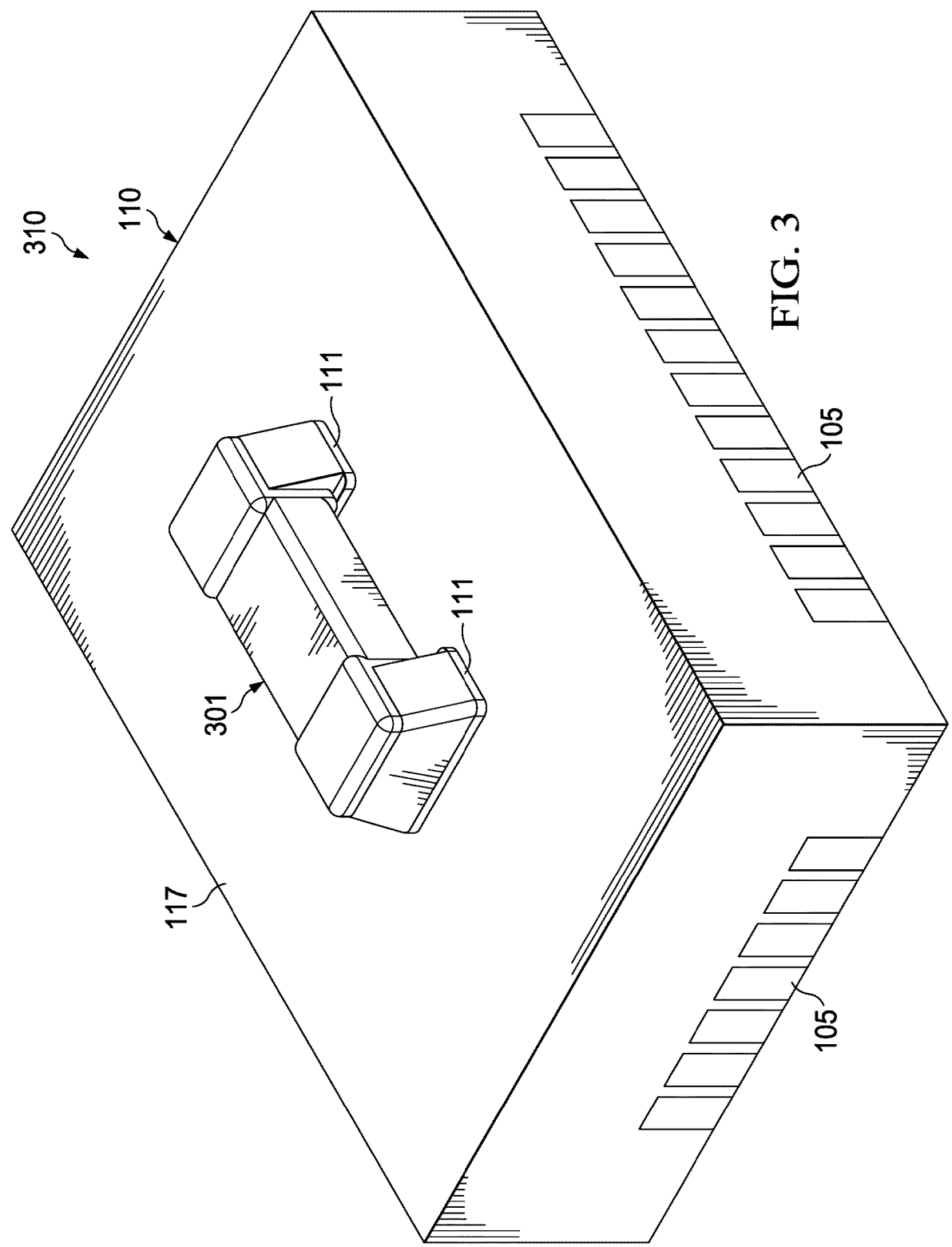
FIG. 3 is a projection view of a packaged semiconductor device with a passive component mounted to an external surface and coupled to a semiconductor device die within the packaged semiconductor device.

FIG. 3 illustrates an example arrangement 310 including packaged semiconductor device 110 and an example external component 301. The external component 301 is mounted to the post interconnects 111 on the surface of the packaged semiconductor device 110. The post interconnects 111 have ends extending through and exposed from the dielectric material 117. Solder or another conductive material electrically couples the external component 301 to the post interconnects 111. Adhesive can be used to adhere the external component 301 to the packaged semiconductor device 110. The example external component 301 has two terminals and can be a passive device such as a resistor, capacitor, inductor, or coil. External component 301 can be a sensor such as a photocell, acoustic device, or receiving or transmissive devices such as optical transmitters or antennas can be used. In additional arrangements, the external component 301 can have additional terminals, and the number of post interconnects in the packaged semiconductor device 110 can be increased to match the number of terminals used.

An aspect of the arrangements is that the length of the post interconnects is directly related to the parasitic capacitance and impedance that will be formed between the semiconductor device die, at one end of the post interconnects, and the external component that is coupled to the other end of the post interconnects. In example arrangements, the post interconnects can range from 50 to 350 microns in length. FIGS. 4A-4D are cross sectional views illustrating arrangements that have various lengths for the post interconnects. In FIG. 4A, arrangement 310 includes an external component 301, for example a two terminal passive device, mounted to a semiconductor device package 110. Semiconductor device die 109 is mounted on a die mount portion 103 of a package substrate 101, for example a conductive leadframe. A die mount portion 103 and leads 105 spaced from the die mount portion are shown as portions of package substrate 101. Bond wires 115 couple bond pads 119 to the leads 105. Dielectric material 117, for example mold compound, covers semiconductor die 109 and portions of package substrate 101. The thickness T1 of the mold compound over the active surface of semiconductor die 109 determines the length L1 of the post interconnects 111. The thickness T2 of the semiconductor die 109 is another distance that can be used to control the thickness T1, as shown below. The thickness T3 is determined by the thickness of the package substrate 101. The total package thickness T is the sum of thicknesses T1, T2 and T3; and in one example is about 600 microns, with approximately equal thicknesses T1, T2, and T3 of about 200 microns each. Other thicknesses can be used, as is further described below. Use of the post interconnects of the arrangements provides a low impedance, low parasitic connection between the semiconductor device die and the external component to be mounted on the semiconductor device package when compared to other connection types, such as bond wires, ribbon bonds, or TSVs.

FIG. 4B illustrates an alternative arrangement. In FIG. 4B, the package thickness T is the same as for the arrangement in FIG. 4A. In an example, it is about 600 microns. The thickness T1A from the surface of the semiconductor die 109 to the surface of the dielectric material 117 (for example mold compound) is now about 100 microns, about half the thickness T1 of 200 microns in FIG. 4A. This thickness T1A also determines the length L1A of the post interconnects 211, 213, which is half the length L1 in FIG. 4A. The thickness of the semiconductor device die 109, T2A, is now increased (when compared to thickness T2 of FIG. 4A), the thickness of the semiconductor device die 109 in this example is now 300 microns, greater than the thickness T2 shown in FIG. 4A, which is about 200 microns. The package substrate 101 has a thickness T3 which is the same in both FIG. 4A and FIG. 4B, about 200 microns. The total thickness T is the same in both FIGS. 4A and 4B, about 600 microns. The parasitic capacitance and impedance or resistance that results from the use of the post interconnects is improved by the use of shorter post interconnects in FIG. 4B, the length L1A in FIG. 4B, which is less than length L1 in FIG. 4A, will result in lower parasitics. Other thicknesses can be used, the arrangement shown in FIG. 4B illustrates that by increasing the thickness T2A of the semiconductor die, the length L1A of the post interconnects can be reduced in a similar package thickness.

FIG. 4C illustrates a cross-sectional view of another arrangement. In FIG. 4C, the thickness T2B of the semiconductor device die 109 is greater than the thickness T2 in FIG. 4A, while the thickness T1B of the dielectric material 117 between the surface of the semiconductor device die 109 and the exterior surface of the package is also less than thickness T1 in FIG. 4A. This reduced thickness T1B can be accomplished by a mechanical grinding or polishing step to thin the dielectric material 117 after the material (such as mold compound) is formed, to thin the thickness of semiconductor device package 110 prior to mounting external component 301. The length L1B of the post interconnects 111 is reduced by the grinding operation. In an example, the total thickness TB of the packaged semiconductor device 110, the sum of T1B, T2B and T3, is about 500 microns; with T1B being about 70 microns, the thickness T2B of the semiconductor device die of about 230 microns, and the thickness T3 of the package substrate 101 is about 200 microns, as in the examples of FIGS. 4A-4B above.

FIG. 4D illustrates an alternative approach to providing the post interconnects 111. In FIG. 4D a spacer 429 is between the semiconductor device die 109 and the package substrate 101, and is placed over the die mounting portion 103 of the package substrate 101. The packaged semiconductor device 110 has a thickness TC that is the sum of four thicknesses, T1C, T2C, T4, and T3. As in the other examples shown in FIG. 4A-4C, the thickness of the package substrate, T3, is about 200 microns. The spacer 329, which can be a metal, dielectric, or a dummy semiconductor die, raises the semiconductor device die 109 towards the upper surface (as oriented in FIG. 4D) of the packaged semiconductor device 110. The thickness T4 in an example is about 265 microns. The thickness of the semiconductor device die can be the same, about 265 microns, or more or less, for example in FIG. 4C, the thickness T2B was about 230 microns. The thickness T1C, which also determines the length L1C of the post interconnects 111, is about 70 microns, however in this example the total package thickness, TC, is greater than the other examples due to the added thickness T4 of the spacer 329, and in one example was about 800 microns, the sum of the four thicknesses T1C. T2B, T4 and T3. Use of the spacer shortens the length of the post interconnects 111, and thereby lowers the parasitic capacitance and impedance in the connections between the external component 301 and the semiconductor device die 109 (when compared to other arrangements.)

While the example arrangements shown in FIGS. 4A-4D have various thicknesses for the package, the semiconductor die, and the package substrate, these examples are used to illustrate the arrangements, in additional arrangements other thicknesses can be used, and different lengths for the post interconnects can be obtained.

Figure 5A:
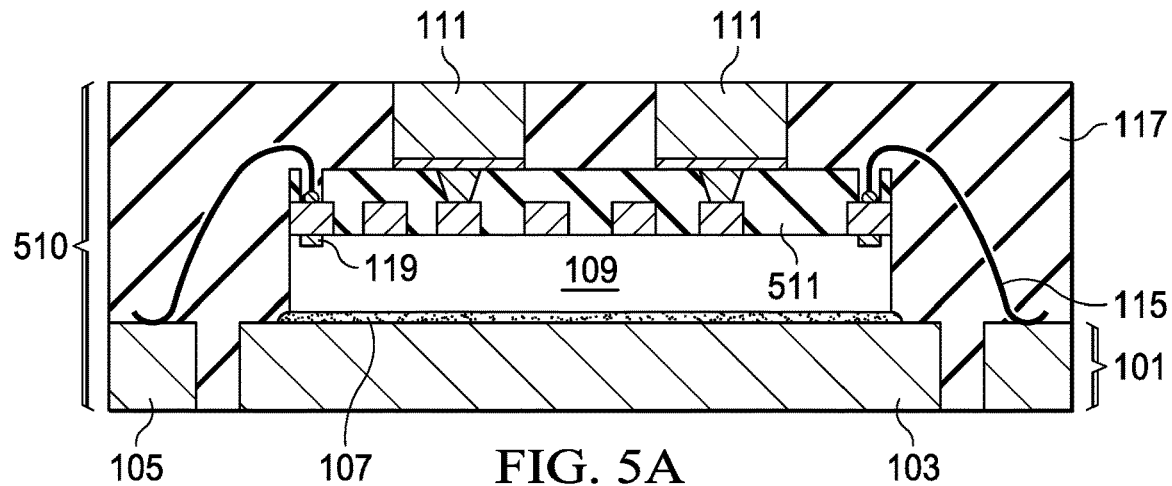
FIGS. 5A-5C are cross sectional views illustrating an arrangement for a packaged semiconductor device with an internal redistribution layer over a semiconductor device die.
Figure 5B:
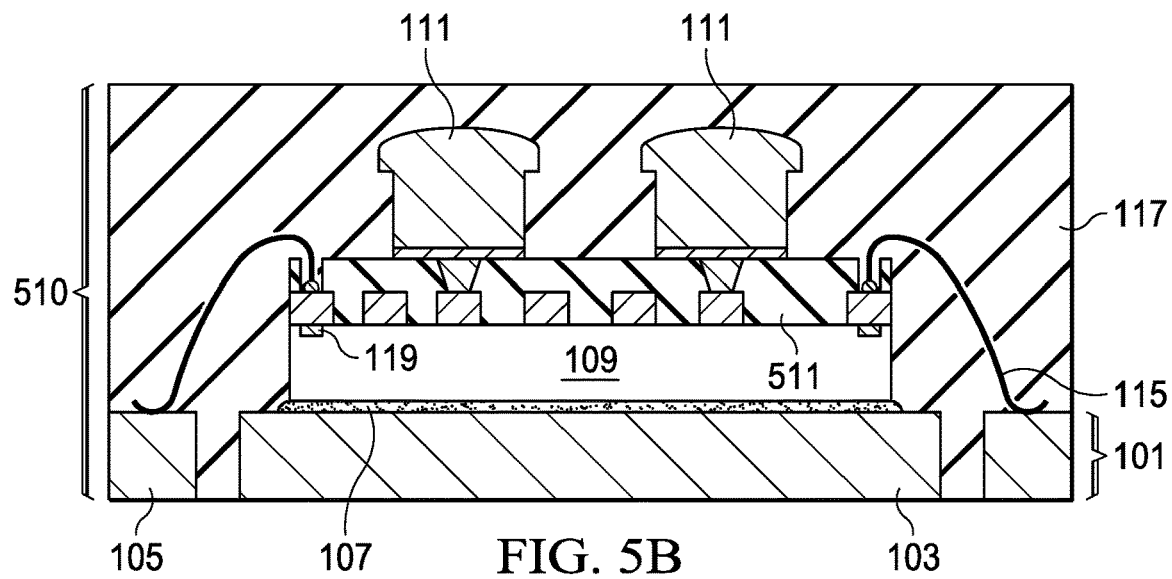
Figure 5C:
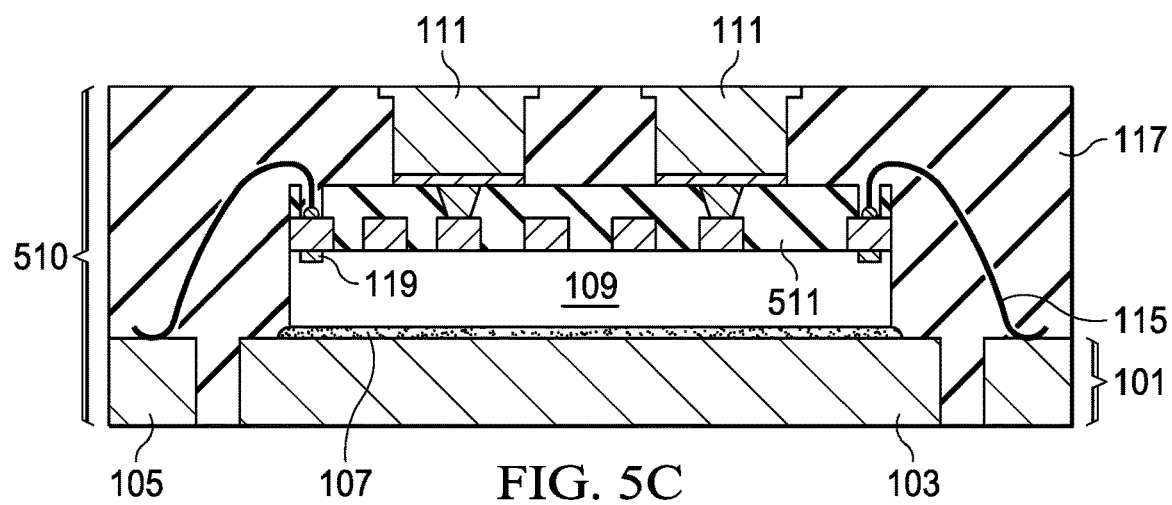

FIGS. 5A-5C illustrate in cross-sectional views example arrangements for a packaged semiconductor device 510 including an internal redistribution layer (RDL) 511 inside the device package. In FIG. 5A, a semiconductor device 109 is mounted to a die mount portion 103 of a package substrate 101. As described above with respect to FIG. 1, the package substrate can be a conductive leadframe, a pre-molded leadframe, a molded interconnect substrate, a circuit board, laminate, tape or film. Leads 105 are part of the package substrate 101 and spaced from the die mount portion 103 to provide external terminals for the packaged device. Bond wires 115 couple leads 105 of the package substrate 110 to bond pads 119 on the active surface of the semiconductor device die 109. The bond pads are electrically coupled to devices within the semiconductor device die. The internal RDL 511 includes a dielectric layer, for example a polyimide, placed over the active surface of the semiconductor device die. Filled or partially filled vias extend through the internal RDL 511 to couple to the post interconnects 111 formed over the internal RDL 511. The post interconnects 111 are electrically coupled to the filled vias to electrically couple the post interconnects 111 to bond pads 119 on semiconductor device die 109. Dielectric material 117 is formed in an encapsulation process to cover the semiconductor device die 109 and portions of the package substrate 110 and the post interconnects 111, and the internal RDL 511. The ends of the post interconnects 111 face away from the semiconductor device die 109 and are exposed form the dielectric material 117 to form terminals for the semiconductor device package 510. These terminals are for coupling a component to be mounted on the package, such as a passive device, to the packaged semiconductor device 510. FIGS. 5B-5C illustrate a method for forming the package 510 in FIG. 5A. In FIG. 5B, post interconnects 111 are completed by electroplating and are overplated to form mushroom shaped ends. Dielectric material 117 is formed in a molding process to encapsulate the semiconductor device die 109, the internal RDL 511, and the post interconnects 111. FIG. 5C illustrates the packaged semiconductor device 510 after a grinding operation removes a portion of the mold compound over the post interconnects 111, exposing the ends of the post interconnects 111, which are made co-planar with the surface of the package after the grinding operation.

The arrangements shown in FIGS. 5A-5C provide additional package design freedom in addition to other benefits of the arrangements described above. In the arrangement of FIG. 1, for example, the placement and design of the bond pads on the semiconductor device die 109 is made in correspondence to the terminal locations of the external component, for example the ends of a two terminal device. The size of the semiconductor device die 109, the location of the bond pads 119, and the size of the external component are limited by the need to provide alignment between the ends of the external component to be mounted on the packaged semiconductor device using the post interconnects, and the bond pads that will couple to the post interconnects. In contrast, in the example arrangements of FIGS. 5A-5C including the internal RDL 511 over the semiconductor device die 109, the package design can accommodate differing placements and sizes of the external component, for example the external component can be placed in different orientations on the packaged semiconductor device. The use of standard or existing semiconductor device dies for the semiconductor die 109 is also made easier in these arrangements, because the bond pad locations do not necessarily determine the post interconnect locations. The internal RDL 511 performs a mapping function that allows the post interconnect locations to be determined while using an existing bond pad location pattern, without changing the bond pad locations. The internal RDL 511 can then map the bond pads to the post interconnect locations needed for the external component.

FIGS. 6A-6B illustrate additional arrangements including an external RDL formed over the packaged semiconductor device prior to mounting the external component. Use of the external RDL between the packaged semiconductor device and the external component or components further increases the flexibility of the arrangements in terms of the size of the semiconductor device die and of the added components. Flexibility is also increased in the placements for the post interconnects and the connections to the added components. For example, larger passive devices that exceed the size of the semiconductor device dies can be mounted to the packaged semiconductor devices.

FIG. 6A is a cross sectional view of an arrangement 610 of a packaged semiconductor device 510 with two post interconnects 211, 213 and having an external RDL 615 over an external surface of the packaged semiconductor device. The packaged semiconductor device 510 has an internal RDL 511 over the semiconductor device die 109. The post interconnects 211, 213 are formed over the internal RDL 511. The external RDL 615 can include multiple layers of conductors with conductors in layers and having vertical conductive vias between the layers. The external RDL 615 can map connections on the packaged semiconductor device side of the external RDL 615 to solder connections on the component side of the external RDL 615. The positions of the external component 301 are not restricted by the positions of the post interconnects 211, 213. In the example of FIG. 6A, the ends of the post interconnects 211, 213 are electrically coupled to the external RDL 615 by solder balls 617. The external RDL 615 can be built on the packaged semiconductor device 510 using a dielectric material and patterning, plating and etching conductors as used in circuit board fabrication. In an alternative arrangement, the external RDL 615 can be formed as a MIS or other pre-built or pre-molded component, or other substrates such as a films, tapes, or circuit boards, and placed on the packaged semiconductor device using adhesives. The external component 301 is mounted to and coupled to the external distribution layer 615, for example using solder.

FIG. 6B illustrates, in another cross sectional view, an arrangement where multiple post interconnects, coupled in parallel, are used to couple bond pads 119 on the semiconductor device die 109 to the external RDL 615 and which then couples to the external component 301. In this arrangement, the bond pads and post interconnects that are sized to align with the bond pads provide parallel electrical paths to lower resistance, and the internal RDL (see 511 in FIG. 6A) is not needed in the packaged semiconductor device. The use of the external RDL 615 allows the freedom to use an external component that may be larger in dimension that the semiconductor device die 109, while using multiple post interconnects keeps the resistance and capacitance added by the connections to the external component low. Use of the external RDL 615 and the post interconnects can also enable the use of a standard or existing semiconductor device die without the need to modify bond pads or bond pad locations on the existing semiconductor device die to accommodate the connections to the external component.

Figure 7A:
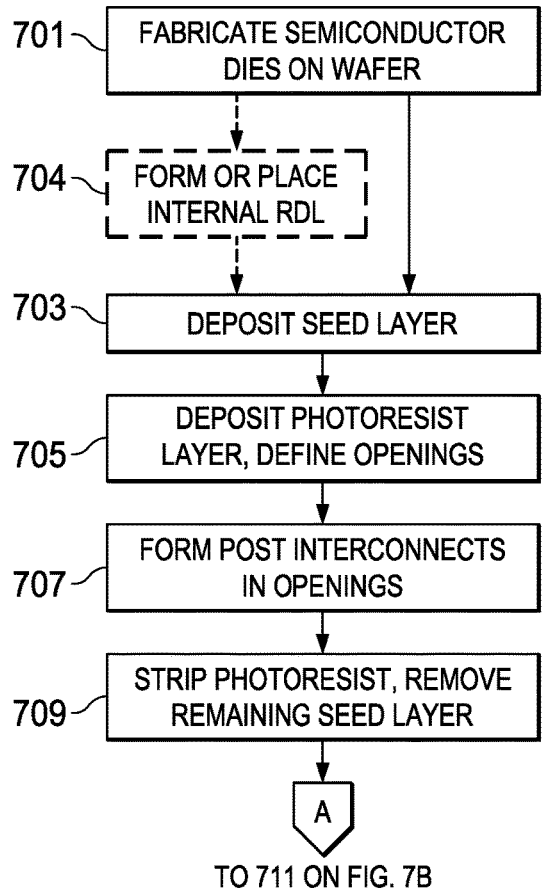
FIGS. 7A-7B are flow diagrams illustrating method arrangements.
Figure 7B:
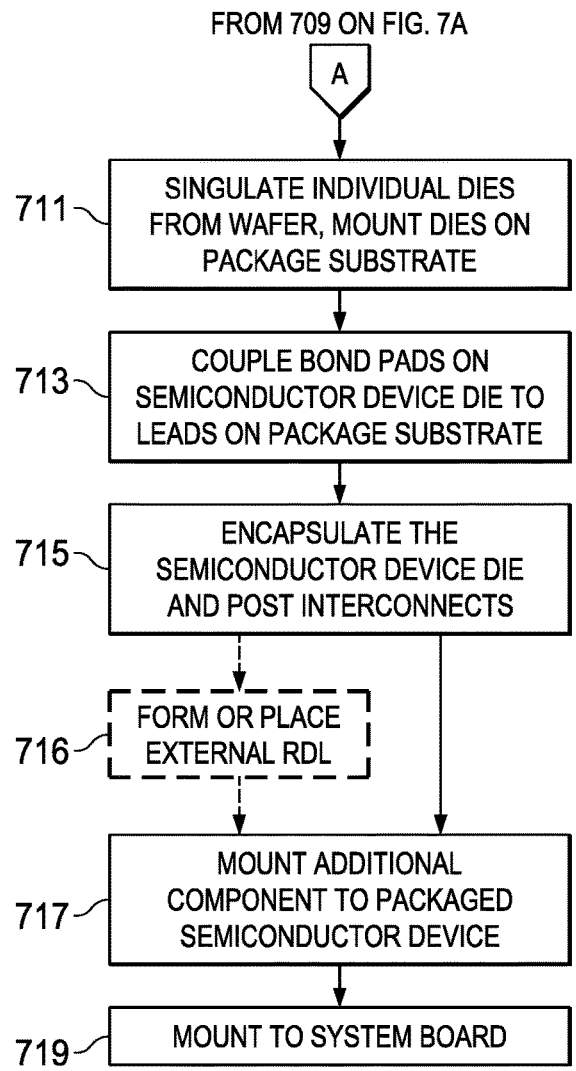

FIGS. 7A-7B are method flow diagrams illustrating selected steps in forming an arrangement. In step 701, a semiconductor device die is fabricated on a wafer and bond pads are formed over an active surface of the semiconductor device die (see semiconductor device die 109 in FIG. 2A.) At step 701, the transition to the next step can be to step 703, or optionally to step 704. In step 704, an internal RDL is placed or formed over the semiconductor device dies (see internal RDL 511 in FIG. 5A). In some arrangements, step 704 is omitted, accordingly optional step 704 is shown in dashed lines in FIG. 7.

At step 703, a seed layer is sputtered or otherwise deposited over the active surface of the semiconductor device dies on the wafer (see seed layer 201 in FIG. 2B). The seed layer is a conductive layer that covers the wafer including the semiconductor device dies, or covers the internal RDL, if present. The seed layer provides a starting material for an electroplating or electroless plating process.

At step 705, a photolithography process is used to form the post interconnects. This begins with deposition of photoresist over the active surface of the semiconductor device dies on the wafer (see photoresist 203 in FIG. 2C). The photoresist is then patterned by exposure, resist development and curing to define post interconnect openings in the photoresist layer over the seed layer (see openings 207 and 209 in FIG. 2D).

At step 707, electroplating or electroless plating is performed to form the post interconnects in openings in the photoresist over the seed layer, (see post interconnects 111 in photoresist 203, in FIG. 2E). At step 709, the photoresist is stripped, and the unused seed layer is stripped, to form the post interconnects extending away from the semiconductor device die (see post interconnects 111 in FIG. 2G).

FIG. 7B illustrates the remaining steps. From step 709 in FIG. 7A, the method transitions to step 711 in FIG. 7B.

At step 711, individual semiconductor device dies are removed from the semiconductor wafer by a singulation process. Laser or sawing cutting operations are performed in a tool for dicing wafers in scribe line areas on the wafer. The individual device dies are mounted on the die mount portion of a package substrate (see semiconductor device die 109 mounted on a die mounting area 103 in FIG. 2H).

At step 713, wire bonding or ribbon bonding is performed to couple the bond pads to leads on the package substrate spaced from the semiconductor die mount portion, (see bond wires 115 in FIG. 2H).

At step 715, a molding process for encapsulation is performed, and the mold compound covers the semiconductor device dies, the bond wires, and portions of the package substrate, while the remaining portions are exposed from the mold compound to form terminals of the package (see the dielectric material 117 in FIG. 2I). The post interconnects have a surface exposed from the mold compound, as described above the end of the post interconnects may extend from the mold compound (see post interconnects 111 in FIG. 2I). Alternatively the exposed surface of the post interconnects may be co-planar with the package formed by the mold compound (see post interconnects 111 in FIG. 5C).

At the transition from step 715, an optional step can be performed. If the external RDL is to be used (see FIG. 6A), the method transitions to step 716, and an external RDL is placed, or formed, over the surface of the packaged semiconductor device, and over the post interconnects, (see external RDL 615 in FIGS. 6A-6B). If the external RDL is not to be used in a particular arrangement, the method continues to step 717.

At step 717, which is entered either from step 715 or from step 714, an external component is mounted to the packaged semiconductor device by mounting to the post interconnects (see external component 301 in FIG. 3) or to the external RDL if present, (see external component 301 in FIGS. 6A-6B). This step of mounting the external component can be done as part of an assembly manufacturing process, or instead can be done at a customer site, the customer receiving the packaged semiconductor device (see 110 in FIG. 2I) with the post interconnects forming terminals for mounting the component.

The method at step 717 provides a complete assembly including a packaged semiconductor device and an external component mounted on and electrically coupled to the packaged semiconductor device die, the post interconnects coupling the added component to the semiconductor device die. At step 719, the assembly is then mounted to a system board or module by surface mount technology, such as solder, solder reflow, or other circuit board assembly steps.

Use of the post interconnects of the arrangements provides increased integration with reduced board area, low loss and low parasitic connections between the external components and the packaged semiconductor devices.

Modifications are possible in the described arrangements, and other alternative arrangements are possible within the scope of the claims.

What is claimed is:

1. An apparatus, comprising:
a package substrate having a die mount portion and lead portions spaced from the die mount portion;
at least one semiconductor device die over the die mount portion of the package substrate, the semiconductor device die having bond pads on a surface facing away from the package substrate;
an electrical connection between a first bond pad of the bond pads and one of the lead portions of the package substrate, wherein the electrical connection includes a bond wire;
a post interconnect over a second bond pad of the bond pads, the post interconnect extending away from the surface of the semiconductor device die; and
a dielectric material covering a portion of the package substrate, the semiconductor device die, a portion of the post interconnect, and the electrical connection, forming a packaged semiconductor device, wherein the post interconnect extends through the dielectric material and includes an end facing away from the semiconductor device die that is exposed from the dielectric material, and wherein the post interconnect has a cross-sectional area that is constant throughout its height.

2. The apparatus of claim 1, and further comprising a component mounted on the packaged semiconductor device, wherein the component is electrically coupled to the post interconnect.

3. The apparatus of claim 2, wherein the component is a passive electrical component.

4. The apparatus of claim 2, wherein the component is a sensor.

5. The apparatus of claim 1, wherein the dielectric material is a mold compound.

6. The apparatus of claim 1, wherein the post interconnect is a column of conductive metal.

7. The apparatus of claim 6, wherein the post interconnect comprises a conductive metal selected from copper, gold, palladium, platinum, nickel, silver, tin and alloys of these.

8. The apparatus of claim 1, wherein the post interconnect is a first post interconnect and the end of the post interconnect is a first end exposed from the dielectric material, and further comprising at least a second post interconnect, the second post interconnect over a third bond pad of the bond pads and extending through the dielectric material and having a second end exposed from the dielectric material, and the first end and second end form two terminals of the packaged semiconductor device.

9. The apparatus of claim 2, wherein the component is an integrated circuit.

10. An apparatus, comprising:
a packaged semiconductor device, comprising:
a semiconductor device die mounted on a package substrate having a surface facing away from the package substrate;

bond pads formed on the surface of the semiconductor device die;
a dielectric material covering the semiconductor device die and a portion of the package substrate; and
post interconnects over the surface of the semiconductor device die, the post interconnects comprising a conductive material extending from the bond pads on the surface of the semiconductor device die through the dielectric material and having ends exposed from the dielectric material of the packaged semiconductor device, wherein the post interconnects have cross-sectional areas that are constant throughout their heights;
a component mounted on the packaged semiconductor device and electrically coupled to at least one of the post interconnects;
a bond wire connecting at least one of the bond pads of the semiconductor device die to a lead portion of the package substrate.

11. The apparatus of claim 10, and wherein the post interconnects comprise one selected from copper, silver, gold, nickel, palladium, platinum, tin, and alloys thereof.

12. The apparatus of claim 10, and further comprising an external redistribution layer between the component mounted on the packaged semiconductor device and the ends of the post interconnects, the external redistribution layer having conductors that electrically couple the component to at least one end of the post interconnects.

13. The apparatus of claim 1, wherein the post interconnect comprises a seed layer formed on the at least one of the bond pads and copper formed on the seed layer.

14. The apparatus of claim 1, wherein the end of the post interconnect exposed from the dielectric material has a first surface co-planar with a second surface of the dielectric material.

15. The apparatus of claim 1, wherein the end of the post interconnect exposed from the dielectric material extends above a surface of the dielectric material.

16. An apparatus, comprising:
a package substrate having a die mount portion and lead portions spaced from the die mount portion;
at least one semiconductor device die over the die mount portion of the package substrate, the semiconductor device die having bond pads on a surface facing away from the package substrate;
an electrical connection between a first bond pad of the bond pads and one of the lead portions of the package substrate;
a post interconnect over a second bond pad of the bond pads, the post interconnect extending away from the surface of the semiconductor device die; and
a dielectric material covering a portion of the package substrate, the semiconductor device die, a portion of the post interconnect, and the electrical connection, forming a packaged semiconductor device, wherein the post interconnect extends through the dielectric material and includes an end facing away from the semiconductor device die that is exposed from the dielectric material, wherein the post interconnect has a cross-sectional area that is constant throughout its height, and wherein the end of the post interconnect exposed from the dielectric material is coated with gold, nickel, tin, palladium, or a combination thereof.

17. The apparatus of claim 1, and further comprising a spacer disposed between the at least one semiconductor device die and the die mount portion of the package substrate.

18. The apparatus of claim 10, wherein the component directly contacts the post interconnects.

19. The apparatus of claim 10, wherein the component is connected to the post interconnects through one or more solder balls.

20. The apparatus of claim 12, and further comprising an adhesive layer between the external redistribution layer and the packaged semiconductor device.

21. A semiconductor package, comprising:
a package substrate;
a semiconductor device over the package substrate with a surface facing away from the package substrate, wherein the semiconductor device includes bond pads formed on the surface;
a bond wire coupling a first bond pad of the bond pads to a lead of the package substrate;
a conductive post connected to and extending from a second bond pad of the bond pads, wherein the first and second bond pads are at a bond pad layer common to the first and second bond pads; and
a dielectric material covering a portion of the package substrate, the semiconductor device, the bond wire, and a portion of the conductive post, wherein the conductive post extends through the dielectric material and includes an end facing away from the semiconductor device that is exposed from the dielectric material.

22. The semiconductor package of claim 21, and further comprising a component above the dielectric material, the component coupled to the end of the conductive post.

23. The semiconductor package of claim 22, and the component includes a passive device, a sensor, or a laser device.

24. The semiconductor package of claim 21, wherein the conductive post has a cross-sectional area that is constant throughout its height.

25. The semiconductor package of claim 21, wherein the conductive post forms a vertical connection through the dielectric material.

26. The semiconductor package of claim 21, wherein the conductive post has a diameter ranging from approximately 50 to approximately 350 microns.

27. The semiconductor package of claim 21, wherein the conductive post has a resistance that is approximately 100 times less than the bond wire.

\* \* \* \* \*